United States Patent
Paillard et al.

(10) Patent No.: US 8,564,339 B2
(45) Date of Patent: Oct. 22, 2013

(54) METHOD AND SYSTEM FOR MEASURING AMPLITUDE AND PHASE DIFFERENCE BETWEEN TWO SINUSOIDAL SIGNALS

(75) Inventors: Bruno Paillard, Sherbrooke (CA); Alex Boudreau, Sherbrooke (CA)

(73) Assignee: Soft DB Inc., Quebec, Quebec ( * ) Notice: Subject to any disclaimer, the term of this patent is extended or adjusted under 35 U.S.C. 154(b) by 0 days.

(21) Appl. No.: 13/587,418

(22) Filed: Aug. 16, 2012

(65) Prior Publication Data

US 2013/0043907 A1 Feb. 21, 2013

Related U.S. Application Data

(60) Provisional application No. 61/525,231, filed on Aug. 19, 2011.

(51) Int. Cl.
*H03L 7/06* (2006.01)
(52) U.S. Cl.
USPC ........................ 327/147; 379/406.09
(58) Field of Classification Search
USPC ............. 327/7, 147, 156, 237, 238, 243, 254, 327/255, 361, 363; 379/406.09
See application file for complete search history.

(56) References Cited

U.S. PATENT DOCUMENTS

| | | | |
|---|---|---|---|
| 6,442,273 B1 * | 8/2002 | Okuda | 379/406.03 |
| 6,696,886 B1 * | 2/2004 | Ke et al. | 327/553 |
| 8,254,589 B2 * | 8/2012 | Mitsuhata | 381/71.11 |
| 2004/0181335 A1 * | 9/2004 | Kim et al. | 701/207 |
| 2010/0104148 A1 * | 4/2010 | Bovik et al. | 382/128 |
| 2011/0134984 A1 * | 6/2011 | Seo | 375/226 |
| 2012/0161834 A1 * | 6/2012 | Lee et al. | 327/156 |
| 2012/0280729 A1 * | 11/2012 | August et al. | 327/156 |

OTHER PUBLICATIONS

Widrow, B. and Stearns, Samuel D.; Adaptive Signal Processing; Prentice-Hall Signal Processing Series, ISBN 0-13-004029 0.

* cited by examiner

*Primary Examiner* — Lincoln Donovan
*Assistant Examiner* — Jung H. Kim
(74) *Attorney, Agent, or Firm* — Goudreau Gage Dubuc; Gwendoline Bruneau

(57) ABSTRACT

A method and a system for measuring amplitude and phase difference between two sinusoidal signals, using an adaptive filter. The method generally comprises measuring a sample of an output signal of a system excited by a sample of a reference signal; using an adaptive filter and the sample of the reference signal to determine a and b coefficients that minimize a prediction error on the sample of the output signal, iteratively, and determining the amplitude and/or phase of the output of the system using the a and b coefficients.

17 Claims, 3 Drawing Sheets

METHOD AND SYSTEM FOR MEASURING AMPLITUDE AND PHASE DIFFERENCE BETWEEN TWO SINUSOIDAL SIGNALS

CROSS REFERENCE TO RELATED APPLICATIONS

This application claims benefit, under 35 U.S.C. §119(e), of U.S. provisional application Ser. No. 61/525,231, filed on Aug. 19, 2011. All documents above are incorporated herein in their entirety by reference.

FIELD OF THE INVENTION

The present invention relates to measurement in the context of digital signal processing. More specifically, the present invention is concerned with a method and system for measuring amplitude and phase difference between two sinusoidal signals.

BACKGROUND OF THE INVENTION

The measurement of the phase between two sinusoidal signals, or phase detection, has a primary role in a number of signal processing applications.

Phase-Locked Loop (PLL) for example may be used in scanning-probe microscopy applications for example, such as Atomic-Force Microscopy, where the probe is a mechanical crystal or resonator which resonance characteristics change as it gets close to the scanned surface. In such an application, a digital phase-locked loop (PLL), as illustrated for example in FIG. 1, is intended to drive a mechanical crystal or resonator 16 so that its transfer phase is constant, typically of about −90 degrees at resonance. The PLL comprises a variable-frequency oscillator 12 and a phase detector 14. It compares the phase of the input signal from the variable-frequency oscillator 12 with the phase of a signal from the mechanical crystal or resonator 16 and adjusts the frequency of the variable-frequency oscillator 12 to keep the phases matched. The signal from the phase detector 14 is used to control the variable-frequency oscillator 12 in a feedback loop. The phase detector 14 is based on a modulation followed by a low-pass filter operation, i.e. on synchronous demodulation. The role of the low-pass filter is to eliminate upper modulation products at twice the modulation frequency. As a result, the filter limits the useful frequency range of the PLL to at most one octave. In addition the filter must be pre-adjusted according to the intended frequency range of the PLL, which affects both the precision and time response of the phase detector 14. If the filter is wide the frequency range is large and the time response is short, but the precision is poor. Conversely, if the filter is narrow, the frequency range is also narrow, the precision is better, but the time response is poor. So, for a phase detector based on synchronous demodulation, the ratio of precision versus time-response of the phase detector is always tied to the intended frequency range of the PLL.

Other fields, such as, for example digital signal processing, digital radio, software-defined-radio, network analyzers, impedance analyzers, LRC-meters, harmonic synthesis . . . etc. use phase detection.

There is a need in the art for a system and a method for measuring amplitude and phase difference between two sinusoidal signals.

The present description refers to a number of documents, the content of which is herein incorporated by reference in their entirety.

SUMMARY OF THE INVENTION

More specifically, in accordance with the present invention, there is provided a phase/amplitude detector, comprising a first input receiving a sample of a reference signal; a second input receiving a sample of an output signal from a system excited by the reference signal; and an adaptive filter using two coefficients a and b associated with the reference signal to estimate the output of the system; wherein the detector determines the amplitude and/or the phase of the output of the system at a current excitation frequency using the following relations: Amplitude=$(a^2+b^2)^{0.5}$ and/or Phase=$\text{Tan}^{-1}(b/a)$.

There is further provided a method for measuring amplitude and/or phase of a sinusoidal signal, comprising a) measuring a sample of an output signal of a system excited by a reference signal; b) using an adaptive filter and a sample of the reference signal to determine a and b coefficients that minimize a prediction error on the sample of the output signal; determining the amplitude and/or phase of the output of the system using the following relations: Amplitude=$(a^2+b^2)^{0.5}$ and/or Phase=$\text{Tan}^{-1}(b/a)$; and repeating from step a).

There is further provided a phase-locked loop circuit driving a system excited by a sine generator in scanning-probe microscopy applications, the circuit comprising an adaptive filter determining and tracking coefficients a and b associated with a sample of a reference signal from the sine generator that minimizes a prediction error on a sample of an output signal from the system, wherein the adaptive filter outputs a control signal to the sine generator based on the phase of the output of the system at a current excitation frequency determined using the following relation: Phase=$\text{Tan}^{-1}(b/a)$.

Other objects, advantages and features of the present invention will become more apparent upon reading of the following non-restrictive description of specific embodiments thereof, given by way of example only with reference to the accompanying drawings.

DESCRIPTION OF EMBODIMENTS OF THE INVENTION

Figure 1:
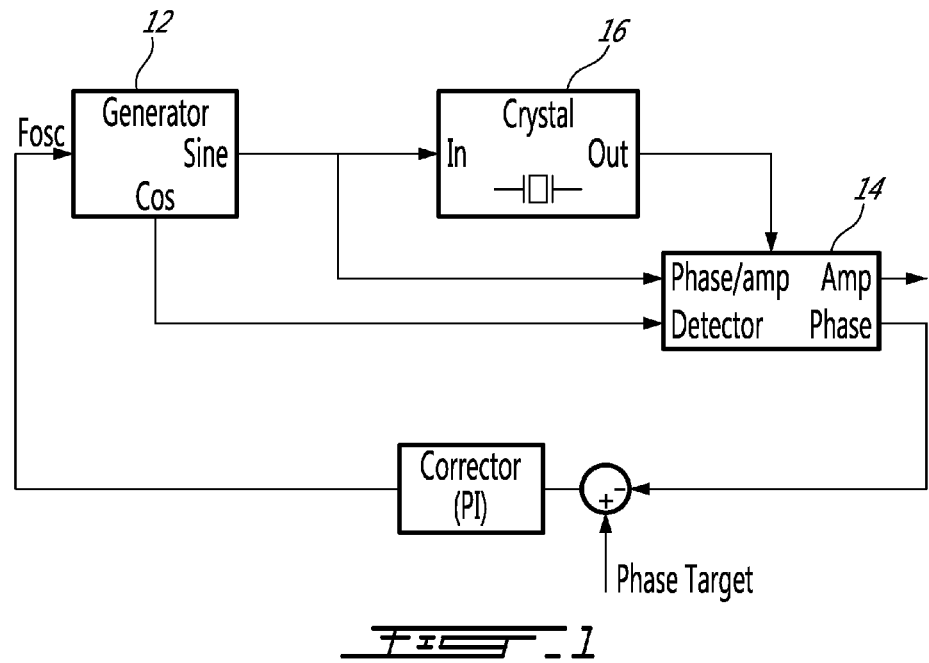
FIG. 1 is a circuit of a resonator and digital PLL, as known in the art.
Figure 2:
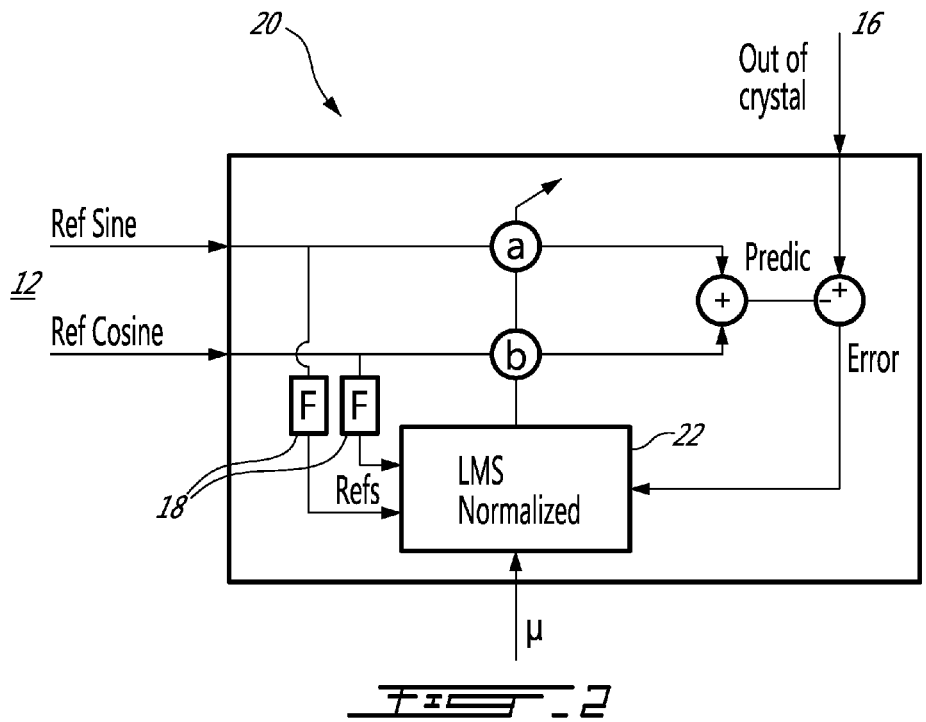
FIG. 2 is a circuit of a phase/amplitude detector according to an embodiment of an aspect of the present invention.

A detector 20 according to an embodiment of an aspect of the present invention is illustrated in FIG. 2, and will be described in an application such as PLL for illustrative purposes.

The detector 20 compares the signal from a sine generator, such as a variable-frequency oscillator 12 with the output signal from a system, such as a resonator 16, using an adaptive filter 22.

The sine generator 12 may be a sine/cosine generator of a recursive type (previously described in Fast and High-Precision Sine Generator for a TMS320C54x fixed-Point DSP Alex Boudreau, Bruno Paillard—Article published on the site of globaldsp.com.), for example, to provide a high-precision synthesis at a very low computational power.

The adaptive filter 22 determines coefficients a and b that minimize a prediction error on a sample of the output signal from the system 16, to estimate the output of the resonator 16 from a sample of the reference quadrature inputs Ref Sine, Ref Cosine.

The coefficients a and b represent the transfer function of the system 16 at a current excitation frequency in the complex plane. From a measurement of the output signal of the system 16 excited by the sine generator 12, the adaptive filter 22 uses the reference signal and an adaptive method to determine the coefficients a and b that minimize the prediction error on the sample of the output signal from the system 16.

The adaptive filter 22 may be a least mean square (LMS) filter for example (see "Adaptive Signal Processing", Bernard Widrow, Samuel D. Stearns, Prentice Hall Signal Processing Series, ISBN 0-13-004029 01). In this case, sample from sample, on an ongoing basis, the adaptive filter 22 determines and tracks the coefficients a and b by the LMS method to predict the output signal of the system 16 with a minimized error in the least mean square sense. These coefficients are weights associated with the reference signal sin and cos. The sum of the weighed sin and cos signals allows generating a signal (Predic) to be compared with the output signal from the system 16. The error between the signal (Predic) and the output signal from the system 16 is used in the adaptive method to optimize the two coefficients a and b for a following iteration.

Other adaptive method may be implemented by the adaptive filter 22.

These coefficients a and b allow the determination of the amplitude and the phase of the output of the system 16 using the following relations:

$$\text{Amplitude} = (a^2 + b^2)^{0.5} \quad (1)$$

$$\text{Phase} = \text{Tan}^{-1}(b/a) \quad (2)$$

In the example of a PLL, the detector 20 can thus send a signal to control the sine generator 12 in the feedback loop.

Since the detector and method works from two orthogonal signals, its convergence speed is on-par with fast adaptive methods. Since it only works in dimension 2, its convergence speed is extremely fast.

This detector and method are very efficient in terms of required computational power.

Compared with traditional phase detectors that are based on modulation techniques, the present phase/amplitude detector 20 does not require any pre- or post-filtering to eliminate modulation quadrature components. It can converge to a very high precision in a fixed, small number of samples, irrespective of the excitation frequency. As a result, when the excitation frequency is low, convergence can be achieved even in a small fraction of the period of the excitation signal.

Compared with a traditional amplitude measurement method of sinusoidal signals, the present method yields a very high precision result in a fixed, small number of samples, irrespective of the signal frequency. As a result, when the frequency is low, amplitude measurement can be achieved even in a small fraction of an excitation period.

Also, as the operating frequency range of the present phase/amplitude detector 20 extends from zero to the Nyquist frequency, i.e. half the sampling frequency, no over sampling is required. This allows using digital/analog converters running at lower frequencies but offering a better precision. In comparison, the operating frequency range of a traditional, modulation-based, phase detector is generally a narrow-band, which extends over at most one octave to positively exclude modulation components at twice the excitation frequency.

When the detector 20 is implemented in a physical analog chain (analog-to-digital converter (ADC), digital-to-analog converter (DAC) . . . etc.), and if the transfer function of the input-output analog chain needs to be corrected for, an F filter 18 may be used to take into account this transfer function (excluding the system under test), as shown in FIG. 2. This loopback transfer function can thus be identified in broadband by the detector 20 in an initial phase. Once identified, this transfer function of the input-output analog chain is essentially a constant, and the present method includes the required correction for the analog chain, which is not possible with traditional methods. In case of an LMS-based filter as illustrated hereinabove, the adaptive filter 22 then performs a Filtered-X LMS.

In a number of applications, this analog-chain transfer function does not need to be identified, for instance in situations where only the relative phase around a point of operation needs to be determined. In that case, the a and b coefficients simply include the transfer function implicitly.

Figure 3:
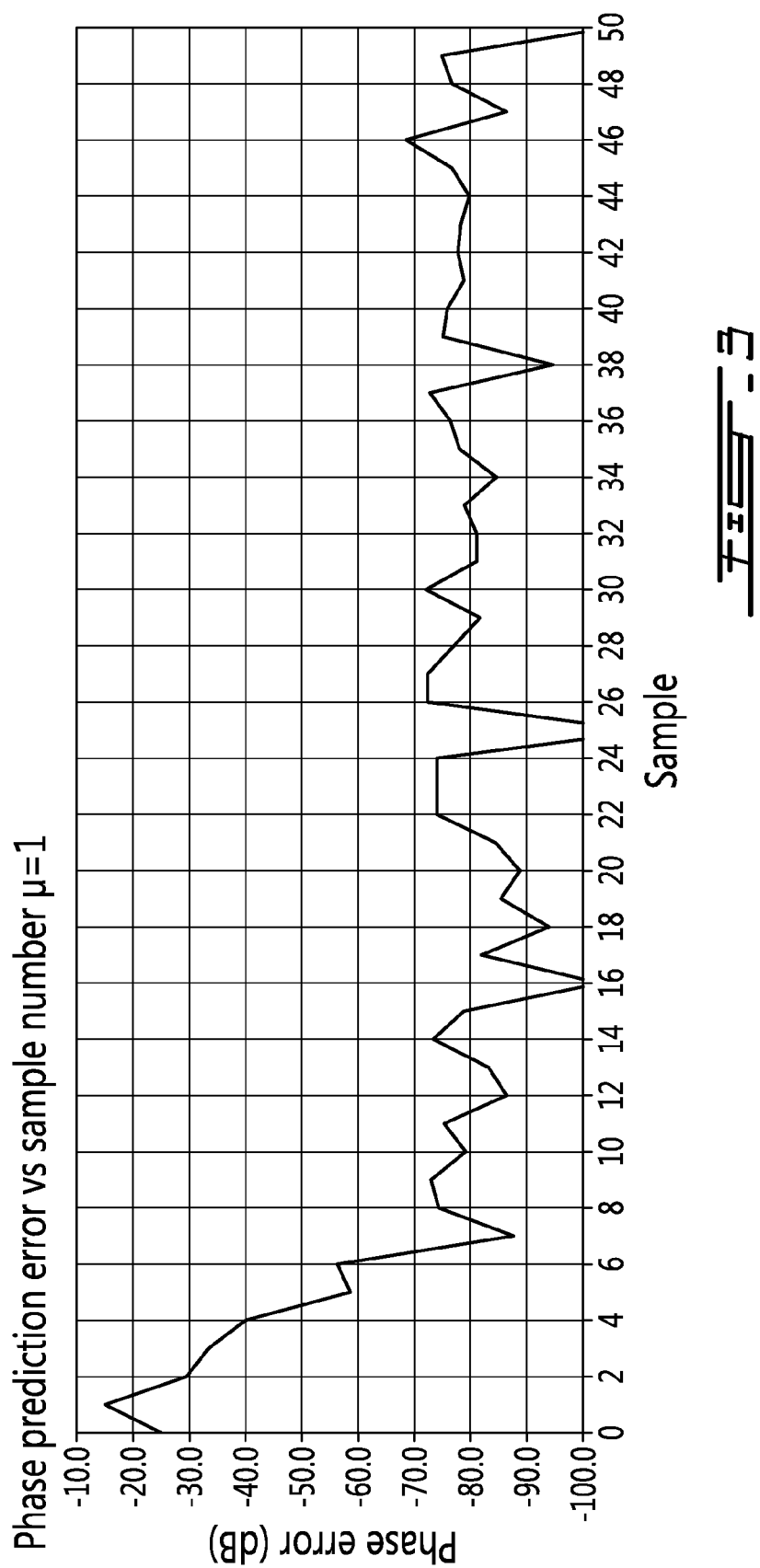
FIG. 3 is a graph showing adaptation for a normalized least mean square filter according to an embodiment of an aspect of the present invention.

The graph in FIG. 3 shows the adaptation, i.e. evolution of the prediction error, in dB, for a normalized LMS filter 22 with the highest adaptation step ($\mu=1$). When a better precision is required, smaller values of the adaptation step are selected to lead to a slower convergence, and a correspondingly smaller misadjustment of a and b.

In this graph the adaptation achieves an error equivalent to the precision of a typical 16-bits acquisition system in as few as 7 samples. As previously indicated, this convergence rate is independent of the excitation frequency. The method also provides the amplitude information, using the same coefficient a and b (see relation 1 above). The convergence rate is the same.

In this test, the method was started from a point where the error was completely unknown. However, in a number of applications, a phase detector is used to track the variations of the phase from one sample to the next. In that case, the method is usually fast enough to keep the error at a very low-level at all times.

A phase detector according to an embodiment of the present invention was used in a PLL for applications in scanning-probe microscopy. In that application, the phase of a 32 kHz resonator could be measured with a 150 KHz sampling rate, rather than a sampling rate in the MHz as needed with traditional, modulation-based, phase detectors. The measurements were as fast as, and more accurate than, with traditional, modulation-based, phase detectors.

Figure 4:
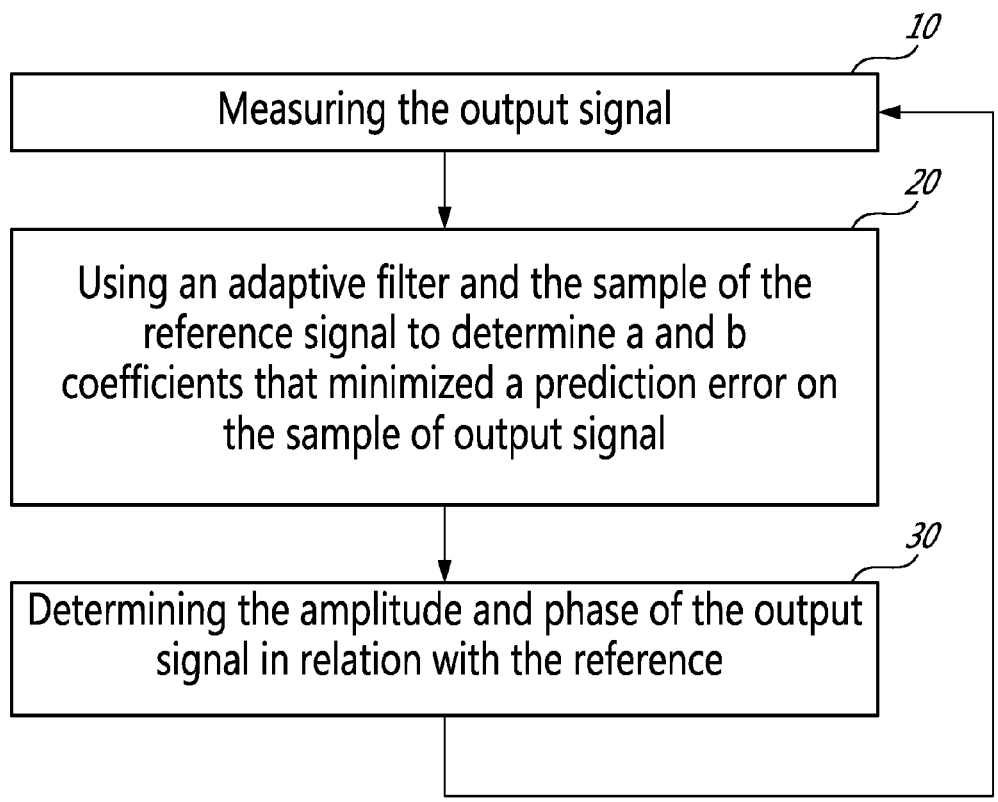
FIG. 4 is a flowchart of a method according to an embodiment of an aspect of the present invention.

FIG. 4 is a flowchart of a method according to an aspect of the invention.

The method generally comprises measuring a sample of an output signal of a system excited by a sample of a reference signal (step 10); using an adaptive filter and the sample of the reference signal to determine a and b coefficients that minimize a prediction error on the sample of the output signal (step 20); determining at least one of: i) the amplitude and ii) phase of the output of the system using the relations (1) and (2) above (step 30); and repeating from step 10.

As described hereinabove, an input-output analog chain transfer function without the system may first be determined, depending on the application.

As people in the art will appreciate, the present system and method allow measuring accurately and very rapidly the phase, independently of the excitation frequency.

As the present phase detector may operate at lower sampling frequency than conventional phase detectors, slower and generally more accurate analog to digital converters may be used.

The present detector and method allow adjusting the trade-off between time response and precision of the detection independently of the frequency range.

The present detector and method may be used in different fields, such as, for example digital signal processing, digital radio, software-defined-radio, network analyzers, impedance analyzers, LRC-meters, phase-locked loops, harmonic synthesis . . . etc.

Although the present invention has been described hereinabove by way of embodiments thereof, it may be modified, without departing from the nature and teachings of the subject invention as recited herein.

What is claimed is:

1. A phase/amplitude detector, comprising:
 a first input receiving a sample of a reference signal;
 a second input receiving a sample of an output signal from a system excited by said reference signal; and
 an adaptive filter, said adaptive filter using two coefficients a and b associated with the reference signal to estimate the output of the system;
 wherein said detector determines at least one of: i) the amplitude and ii) the phase of the output of the system at a current excitation frequency using the following relations:

$$\text{Amplitude} = (a^2 + b^2)^{0.5} \text{ and}$$

$$\text{Phase} = \text{Tan}^{-1}(b/a).$$

2. The phase/amplitude detector of claim 1, wherein said adaptive filter is a least mean square (LMS) filter, said LMS filter determining and tracking the coefficients a and b producing a least mean square error signal to predict the output signal of the system.

3. The phase/amplitude detector of claim 1, wherein said adaptive filter is a filtered-X least mean square filter (filtered-X-LMS filter).

4. The phase/amplitude detector of claim 1, wherein a trade-off between a time response and a precision of said detector is directly adjusted by selecting a step-size of said adaptive filter independently of the frequency range.

5. The phase/amplitude detector of claim 1, having an operating frequency range from zero to the Nyquist frequency.

6. The phase/amplitude detector of claim 1, wherein said reference signal is a low frequency excitation signal, said detector converging in a small fraction of the period of the excitation signal.

7. The phase/amplitude detector of claim 1, used in one of: a digital phase-locked loop (PLL), digital signal processing, digital radio, software-defined-radio, network analyzers, impedance analyzers, LRC-meters, phase-locked loops and harmonic synthesis.

8. The phase/amplitude detector of claim 1, used in a digital phase-locked loop (PLL) in scanning-probe microscopy applications.

9. A method for measuring at least one of i) amplitude and ii) phase of a sinusoidal signal, comprising:
 a) measuring a sample of an output signal of a system excited by a reference signal;
 b) using an adaptive filter and a sample of the reference signal to determine a and b coefficients that minimize a prediction error on the sample of the output signal;
 c) determining at least one of: i) the amplitude and ii) phase of the output of the system using the following relations:

$$\text{Amplitude} = (a^2 + b^2)^{0.5} \text{ and}$$

$$\text{Phase} = \text{Tan}^{-1}(b/a); \text{ and}$$

d) repeating from said step a).

10. The method of claim 9, wherein said step b) comprises using a LMS filter.

11. The method of claim 9, wherein said step b) comprises using a filtered-X LMS filter.

12. The method of claim 9, comprising selecting a step-size of the adaptive filter to directly adjust a trade-off between time response and precision of measurement independently of the frequency range.

13. The method of claim 9, implemented in a physical analog chain, said method comprising, before said step a), determining the transfer function of the analog chain in absence of the system.

14. The method of claim 9, having a convergence time that is independent of the excitation frequency.

15. The method of claim 9, wherein the reference signal is a low frequency excitation signal, said method converging in a small fraction of the period of the excitation signal.

16. The method of claim 9, used in one of: a phase-locked loop (PLL), digital signal processing, digital radio, software-defined-radio, network analyzers, impedance analyzers, LRC-meters, phase-locked loops and harmonic synthesis.

17. The method of claim 9, used in a phase-locked loop (PLL) in scanning-probe microscopy applications.

* * * * *